United States Patent
Moise et al.

(10) Patent No.: US 6,225,655 B1
(45) Date of Patent: May 1, 2001

(54) FERROELECTRIC TRANSISTORS USING THIN FILM SEMICONDUCTOR GATE ELECTRODES

(75) Inventors: Theodore S. Moise; Scott R. Summerfelt, both of Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/953,947

(22) Filed: Oct. 20, 1997

Related U.S. Application Data

(60) Provisional application No. 60/029,168, filed on Oct. 25, 1996.

(51) Int. Cl.$^7$ .................................................. H01L 29/76
(52) U.S. Cl. ........................ 257/295; 257/233; 257/314; 257/315; 257/316; 257/317; 257/352; 257/368; 365/145
(58) Field of Search ..................... 257/295, 315, 257/233, 314, 352, 368, 317, 316; 365/145

(56) References Cited

U.S. PATENT DOCUMENTS

| | | | |
|---|---|---|---|
| 4,000,427 | 12/1976 | Hoffmann | 307/238 |
| 4,888,630 | * 12/1989 | Paterson | 357/23 |
| 5,070,385 | 12/1991 | Evans, Jr. et al. | 357/51 |
| 5,119,329 | 6/1992 | Evans, Jr. et al. | 365/145 |
| 5,304,502 | * 4/1994 | Hanagasaki | 437/41 |
| 5,307,305 | 4/1994 | Takasu | 365/145 |
| 5,345,414 | 9/1994 | Nakamura | 365/145 |
| 5,361,225 | 11/1994 | Ozawa | 365/145 |
| 5,365,094 | * 11/1994 | Takasu | 257/295 |
| 5,373,462 | 12/1994 | Achard et al. | 365/145 |
| 5,523,964 | * 6/1996 | McMillan et al. | 365/145 |
| 5,579,258 | * 11/1996 | Adachi | 365/145 |
| 5,767,543 | * 6/1998 | Ooms et al. | 257/315 |
| 5,789,775 | * 8/1998 | Evans, Jr. et al. | 257/295 |

OTHER PUBLICATIONS

Burfast and Taylor, "Polar Dielectrics and Their Applications", 1979.

T. Nakamura, et al. "Mechanisms for the operation of thin film transistors on ferroelectrics" Integrated Ferroelectrics 1995, vol. 6, pp. 47–68.

* cited by examiner

*Primary Examiner*—Carl Whitehead, Jr.
*Assistant Examiner*—Matthew E. Warren
(74) *Attorney, Agent, or Firm*—David Denker; Wade James Brady, III; Frederick J. Telecky, Jr.

(57) ABSTRACT

A ferroelectric structure on an integrated circuit is disclosed, which may be used, for instance, in a high-speed, non-volatile, non-destructive readout random-access memory device. Generally, the ferroelectric structure combines a thin film ferroelectric variable resistor and a substrate (e.g. silicon) transistor, using a semiconducting film which is common to both. A field effect transistor 26 integrated into substrate 30 has a gate oxide 36 and a semiconducting gate electrode 38 with electrical connections at a first end 44 and a second end 46. Overlying gate electrode 38 is a ferroelectric thin film 40 and a conductive electrode 42. The polarization of ferroelectric thin film 40 is set by applying an appropriate voltage between gate electrode 38 and conductive electrode 42. The polarization of ferroelectric thin film 40 may be subsequently determined by applying a read voltage to 42 and 44, thus causing a voltage $V_2$ to appear at 46 which is determined by the polarization of the ferroelectric variable resistor formed by 38 and 40. Since 38 also forms the gate electrode for field effect transistor 26, the magnitude of $V_2$ affects the magnitude of current $I_2$. Thus $I_2$ is effectively an amplified signal related to the ferroelectric variable resistance which may be read without perturbing the polarization of ferroelectric thin film 40.

15 Claims, 3 Drawing Sheets

FERROELECTRIC TRANSISTORS USING THIN FILM SEMICONDUCTOR GATE ELECTRODES

This application claims benefit to U.S. provisional application serial No. 60/029,168 filed Oct. 25, 1996.

FIELD OF THE INVENTION

This invention relates generally to structures and methods for integrated circuits and more specifically to integrated circuit ferroelectric transistors.

BACKGROUND OF THE INVENTION

Random access memory integrated circuits typically contain millions of essentially identical cells integrated on a single-crystal silicon substrate, each cell capable of storing one bit of digital information. Dynamic random access memory (DRAM) cells are popular because of their relatively simple cell structure, usually consisting of a single capacitor storage element coupled to an access transistor. However, DRAM memory is volatile and must be frequently refreshed to maintain data integrity. Also, reading the data stored in a DRAM cell is a destructive process, such that the data must be rewritten each time it is read. A further problem with the basic DRAM structure is the inherent difficulty in scaling the memory cell to smaller size, since the charge storage requirements for the cell capacitor do not scale proportionally. As a result, alternative materials and structures are now receiving serious consideration for memory applications.

Ferroelectric random access memory (FRAM) structures make use of the remanent polarization properties of a ferroelectric material to store data. FRAMs may generally be divided into two types, depending on whether a ferroelectric capacitor or a ferroelectric transistor is used as the storage element in a memory cell. A capacitor-based FRAM is similar to a DRAM in operation and basic layout, and while it may have the advantage of non-volatile data storage, it still has a destructive readout and a scaling problem. In contrast, transistor-based FRAM cells are generally more complex, but in theory offer higher performance; such cells have been proposed with both non-volatile storage and non-destructive readout features. Unfortunately, researchers have been largely unsuccessful in their attempts to deposit ferroelectric thin films as gate dielectrics directly upon silicon transistors, a necessary step for commercial development of these basic transistor FRAMs.

An alternative FRAM structure is disclosed by Evans et al. in U.S. Pat. No. 5,119,329, issued Jun. 2, 1992, which avoids interfacing ferroelectric material directly with a silicon substrate by using a thin film semiconductor overlying a ferroelectric thin film as the storage device. The thin film semiconductor operates as a variable resistor with resistance set by the polarization state of the ferroelectric material, such that data may be read from the device by sensing the resistance of the thin film semiconductor which overlies the ferroelectric material.

SUMMARY OF THE INVENTION

The present invention provides a novel method and ferroelectric structure for overcoming the difficulties found in prior art ferroelectric device fabrication and utilization, by integrating a ferroelectric variable resistor and a silicon transistor in a single device. This is apparently the first ferroelectric structure to combine a thin film ferroelectric variable resistor and a substrate (e.g. silicon) transistor, using a semiconducting thin film which is common to both. This novel structure can provide fast access times, non-volatile storage, non-destructive readout, and has wide application including, but not limited to, memory, programmable logic, multi-state logic, and programmable variable resistors (e.g. for neural network applications).

The structure of the present invention provides many advantages over prior art structures, both in operation and in fabrication. For instance, the substrate transistor may be largely identical to other transistors integrated on the same circuit, up to and including the gate dielectric. The thin film semiconductor may be selected to provide compatibility with both this gate dielectric and the ferroelectric material (many oxide semiconductors are particularly suited for such an application). The structure also advantageously avoids direct ferroelectric material/silicon interfaces and their related problems.

Additionally, the present invention solves a problem with thin film semiconducting materials. Because these materials are typically polycrystalline, they do not generally provide the on/off resistance ratios and process controllability achievable with bulk single-crystal silicon. However, the transistor of the present invention is self-amplifying and preferably uses the drain current of a silicon transistor as an output; this novel feature allows the device to be much smaller than prior art thin film semiconductor devices, and at the same time allows the device to operate reliably with extremely small access times. Also, because the output of the device is generally taken from the transistor fabricated in the substrate, properties of the thin film semiconductor are less critical; in some embodiments, criticality may be further reduced as important operational parameters are related to dimensionally adjustable ratios.

Generally, the present invention provides a structure for a microelectronic device. This device comprises a field effect transistor formed in a semiconducting substrate and having a semiconducting thin film gate electrode. The device may further comprise a ferroelectric thin film deposited on and overlapping at least a portion of the semiconducting thin film gate electrode. Preferably, a conductive electrode overlies the ferroelectric thin film and is used to set the polarization of the ferroelectric thin film.

In another aspect, the present invention provides a method of fabricating a semiconductor device, comprising depositing a gate dielectric thin film on a semiconducting substrate, depositing a semiconducting thin film on the gate dielectric thin film, and depositing a ferroelectric thin film on the semiconducting thin film. The method may further comprise depositing a conductive thin film on the ferroelectric thin film. Various patterning steps affecting one or more of the films may be combined with the method to produce a variety of related structures according to the present invention.

In yet another aspect, the present invention provides a method of producing a signal corresponding to the polarization state of a ferroelectric layer. The method may be used in a system having a ferroelectric layer interposed between a conducting electrode and a semiconducting thin film electrode, wherein the semiconducting thin film electrode also forms a gate electrode for a field effect transistor integrated into a substrate and having a source and a drain. The method comprises applying a first voltage to the conducting electrode and to a first end of the semiconducting thin film electrode, thereby causing a first current to flow laterally in the semiconducting thin film electrode and a second voltage to appear at a second end of the semiconducting thin film electrode, with the magnitude of the first current and the second voltage dependent on the polarization state of the ferroelectric layer. The method further comprises applying a third voltage across the source and drain of the field effect transistor, thereby causing a second current to flow between the source and drain of the field effect transistor, with the magnitude of the second current dependent on the first and second voltages, whereby the magnitude of the second current is an amplified signal dependent on the polarization state of the ferroelectric layer and the amplified signal is readable without altering the polarization state of the ferroelectric layer.

BRIEF DESCRIPTION OF THE DRAWINGS

The present invention, including various features and advantages thereof, may be best understood by reference to the following drawing, wherein.

DETAILED DESCRIPTION OF THE PREFERRED EMBODIMENTS

The present invention relates to a ferroelectric structure for integrated circuits and methods of fabricating and using the same. Several preferred embodiments are described herein with reference to a storage element for a memory cell, with the realization that the present invention may have broad applicability in other types of integrated circuits.

Figure 1:
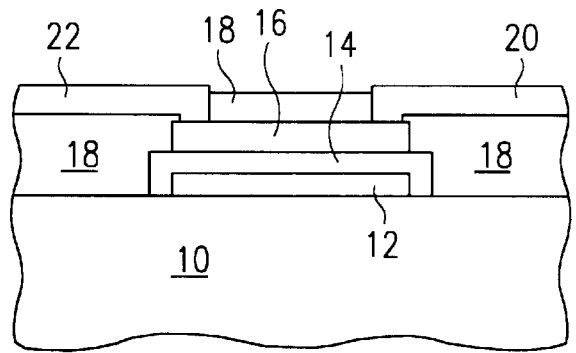
FIG. 1 illustrates a prior art semiconducting thin film variable resistance element.

FIG. 1 illustrates a prior art ferroelectric variable resistance element as taught in the '329 patent. This element consists of a bottom electrode 12, a lead lanthanum zirconate tantalate (PLZT) ferroelectric layer 14, and an indium-doped tin oxide semiconductor contact 16 deposited on a semiconductor substrate 10. An interlayer dielectric 18 and electrical contacts 20 and 22 are also illustrated.

Ferroelectric layer 14 is polarized by applying a voltage between semiconductor contact 16 and bottom electrode 12, referred to herein as a programming voltage. Typically, polarization is accomplished by first applying a saturation voltage which initializes the ferroelectric polarization to a known value, then applying the programming voltage. For digital applications, this process may be simplified if positive and negative programming voltages are selected which are sufficient to saturate the ferroelectric regardless of the prior state.

The resistivity of semiconductor contact 16 is affected by the presence of an electric field oriented perpendicular to the plane of the substrate. Semiconductor contact 16 has an intrinsic resistivity which may be measured in the absence of an electric field. When adjacent ferroelectric layer 14 is polarized, an electric field is generated in semiconductor contact 16. This field will either draw additional carriers into or repel existing carriers out of semiconductor contact 16, depending on the direction of polarization and type of semiconductor. This effect respectively lowers or raises the resistance of the semiconductor contact from the intrinsic value, a condition which can be sensed using electrical contacts 20 and 22.

The prior art device of FIG. 1 has several disadvantages. Thin film semiconductors do not generally provide the on/off resistance ratios and process controllability achievable with bulk single-crystal silicon. As a result, such variable resistors typically must consume substantial substrate surface area in order to provide sufficient resistance swings for remote sensing, and to reduce parameter variability between devices. This not only limits usage in ultra-dense applications, but also limits device speed.

Figure 2:
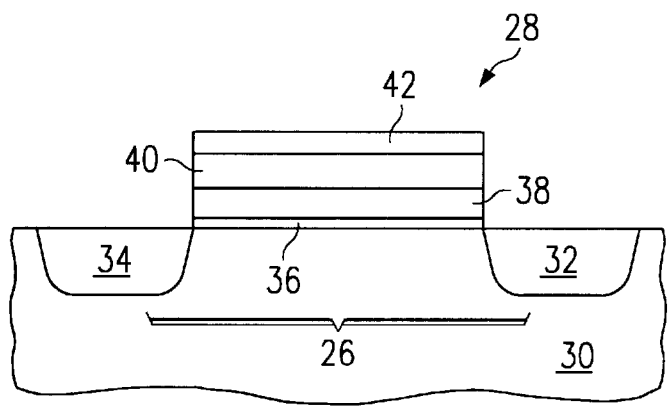
FIG. 2 illustrates a ferroelectric device according to the present invention.

A ferroelectric device 28 in accordance with the present invention is shown in FIG. 2. A substrate 30 (e.g. silicon) contains a drain region 32 and a source region 34. A gate dielectric 36, which may be formed of stacked $SiO_2$ and $Si_3N_4$ sublayers as is common in the art, overlies a channel region between drain region 32 and source region 34. A semiconducting thin film gate electrode 38 is fabricated on gate dielectric 36. Gate electrode 36 is preferably an oxide semiconducting material (e.g. tin oxide, indium oxide, or a combination of these). A ferroelectric thin film 40, of a material such as barium strontium titanate, overlies semiconducting gate electrode 38. A conductive electrode 42 overlies ferroelectric thin film 40.

Figure 3:
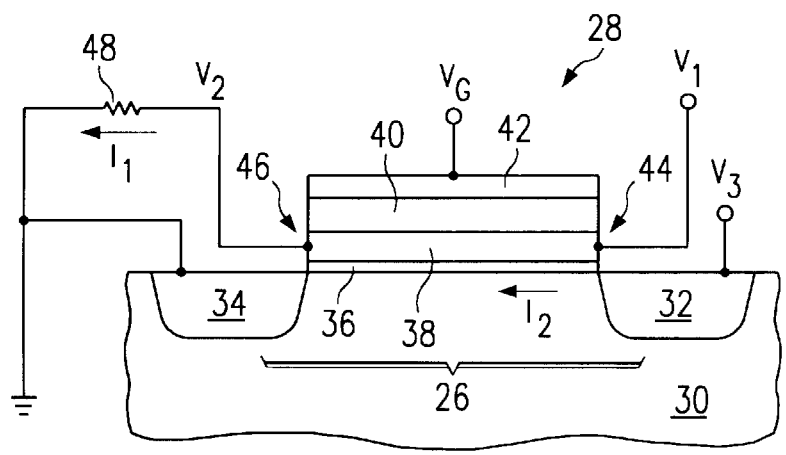
FIG. 3 shows one possible configuration for using a ferroelectric device according to the present invention.

One possible utilization of device 28 is shown in FIG. 3. It should be understood that various effects may be achieved by choosing a particular combination of n-type or p-type material for semiconducting gate electrode 38, n-channel or p-channel substrate transistor, and depletion or enhancement mode operation for the substrate transistor. Several of these combinations are explained herein, but a general operational description for binary operation may be given at this point without regard to material conductivity types and doping levels.

FIG. 3 shows electrical connections to a first end 44 and a second end 46 of semiconducting gate electrode 38. Second end 46 is shown connected to ground through a resistor 48, which may be formed, e.g. from a MOS transistor or as a purely passive device. The polarization of ferroelectric thin film 40 is accomplished by applying an appropriate programming voltage $V_G$-$V_1$ between conductive electrode 42 and first end 44 of semiconducting gate electrode 38.

The polarization of ferroelectric thin film 40 may be subsequently determined in the following non-destructive manner. $V_G$ and $V_1$ are set to a first voltage (i.e. a read voltage), thus insuring that no appreciable external field is applied to ferroelectric thin film 40. This causes a first current $I_1$ to flow laterally between first end 44 and second end 46 of semiconducting thin film 38 and through resistor 48. Voltage $V_1$ is split between 38 and 48 in this process, thus voltage $V_2$ appearing at second end 46 of semiconducting thin film 38 depends on the relative resistance values of 38 and 48. Because the polarization of ferroelectric thin film 40 affects the resistivity of semiconducting thin film 38, the magnitude of both $I_1$ and $V_2$ depend on the polarization of ferroelectric thin film 40. If semiconducting thin film 38 is in a low resistance state, $V_2$ may be near $V_1$; conversely, if semiconducting thin film 38 is in a high resistance state, $V_2$ may be near ground.

When a drain voltage $V_3$ is applied to drain 32 under these conditions, a current $I_2$ will flow between drain 32 and source 34 of field effect transistor 26. However, unlike conventional field effect transistors which have a uniform gate voltage, the semiconductive gate presents a gate voltage which varies from $V_1$ near drain 32 to $V_2$ near source 34. This variation may be small when semiconductive thin film 38 is in a low resistance state, but may be large when 38 is in a high resistance state. Thus the channel conductivity in field effect transistor 26, particularly near source 34, depends ultimately on the polarization of ferroelectric thin film 40. Generally, the maximum current swings observed in $I_2$ will be much greater than those of $I_1$; thus the device is in effect self-amplifying. This attribute is particularly attractive for ultra-dense memory and/or high-speed memory applications, where remote sense amplifiers must discern the state of a memory cell in the presence of masking effects, e.g., bitline capacitance and resistance.

Figure 4A:
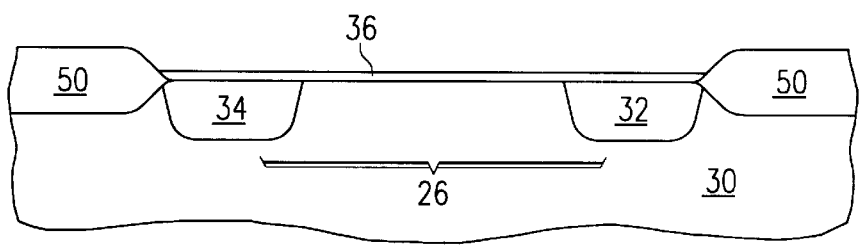
FIGS. 4A–4E contain cross-sections corresponding to fabrication steps in one embodiment of the invention.

Also of considerable importance is the manufacturability of a ferroelectric device. The prospects for deposition of high quality ferroelectric gate dielectrics directly on a silicon substrate do not appear promising; the present invention provides a solution which avoids a ferroelectric/silicon interface. FIGS. 4A–4E illustrate a fabrication method according to one embodiment of the present invention. FIG. 4A shows a p-doped silicon substrate 30 at a point in fabrication well known in the art, with n-doped impurity regions forming drain and source regions 32 and 34, gate dielectric 36 (e.g. comprising a bottom $SiO_2$ film and a top $Si_3N_4$ film) disposed over a portion of the substrate, and field oxide 50 disposed over an adjacent portion of the substrate. It may be preferable to form regions 32 and 34 later in fabrication, i.e. with a self-aligned process using one or more subsequently formed gate layers as a mask to align regions 32 and 34.

Figure 4B:
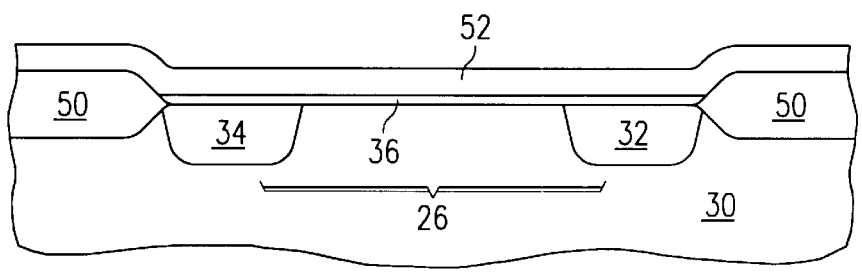

Next, a semiconducting thin film 52 as shown in FIG. 4B may be deposited, preferably using conventional techniques such as sputtering, metal-organic decomposition of spin-on precursors, or chemical vapor deposition. Metal-organic chemical vapor deposition in an oxygen ambient is preferred for oxide semiconductors, such as indium oxide, tin oxide, or donor-doped perovskite oxides. Donor-doped perovskite-phase oxides (such as erbium-doped strontium titanate) may have particularly high stability during subsequent deposition of the ferroelectric film, which is generally also a perovskite-phase oxide. In any case, the carrier concentration of semiconducting thin film 52 may be set during deposition or changed by thermal treatment, diffusion, or ion implantation after deposition. For instance, a tin oxide thin film 52 may be doped with indium to make an n-type semiconductor thin film. Optimum thickness of film 52 generally depends on the application and operating voltages and fields, with films of several hundred angstroms being typical.

Figure 4C:
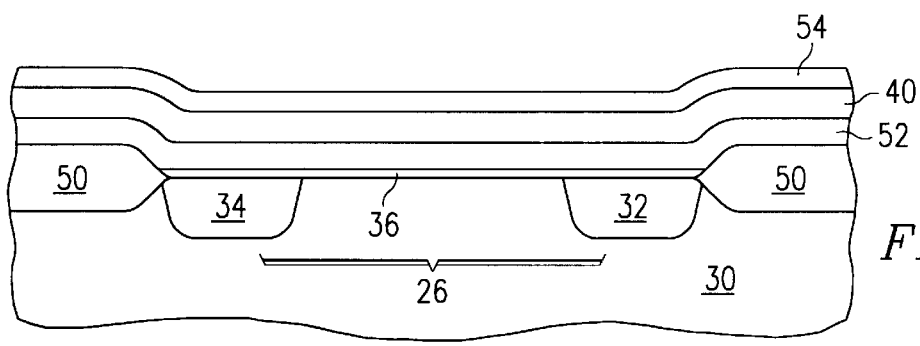

Ferroelectric thin film 40 shown in FIG. 4C may be deposited using conventional techniques such as sputtering, metal-organic decomposition of spin-on precursors, or chemical vapor deposition. Some examples of suitable ferroelectric materials include barium strontium titanate, barium titanate, bismuth titanate, lead zirconate titanate and lead lanthanum zirconate titanate. These materials may be donor and/or acceptor doped to enhance their ferroelectric and electrical properties. A conductive thin film 54 may then be formed in contact with the top surface of ferroelectric thin film 40. One preferred material for thin film 54 is platinum.

Figure 4D:
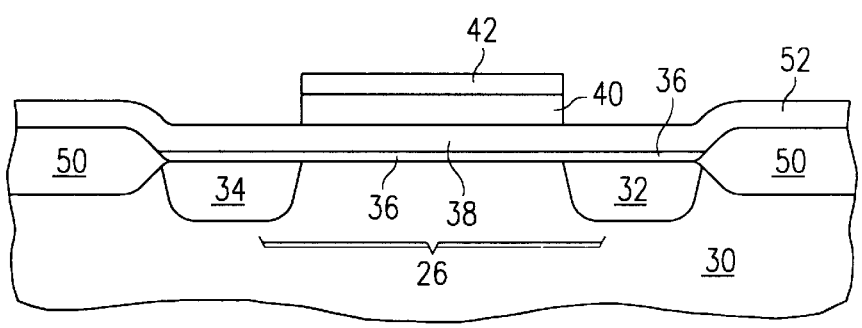

Films 52, 40 and 54 may be subsequently patterned, for instance using standard semiconductor photolithography and etching techniques, to create a cross-section such as that shown in FIGS. 4D and 4E. In this embodiment, conductive electrode 42 is patterned from film 54, and ferroelectric film 40 is patterned identically, preferably to align with the gate of substrate field effect transistor 26. Semiconducting thin film 52 may be patterned to create a semiconducting gate electrode 38 with first and second ends 44 and 46 which extend over drain and source regions 32 and 34. This allows for formation of laterally opposed contacts to semiconducting gate electrode 38; additionally, the resistivity of first and second ends 44 and 46 of gate electrode 38 may be altered in a self-aligned manner using electrode 42 and ferroelectric film 40 as a mask. This may be used to create low-resistivity (or high-resistivity) contact regions for gate electrode 38.

Figure 4E:
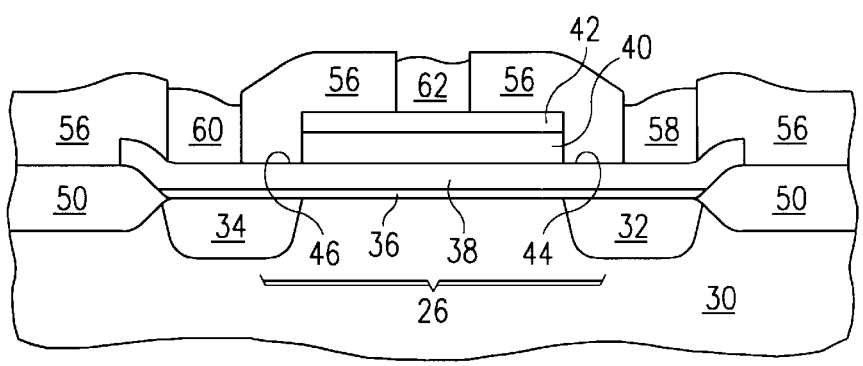

FIG. 4E shows additional elements, including an interlayer dielectric 56, which may be formed using one of many conventional processes such as chemical vapor deposition of TEOS, and several contacts, including first contact 58 and second contact 60 to semiconducting gate electrode 38 and ferroelectric gate contact 62 to conductive electrode 42. These contacts may be formed for instance of one or more layers of titanium nitride, tungsten, titanium/tungsten, aluminum, or other conventional contact materials.

Figure 5:
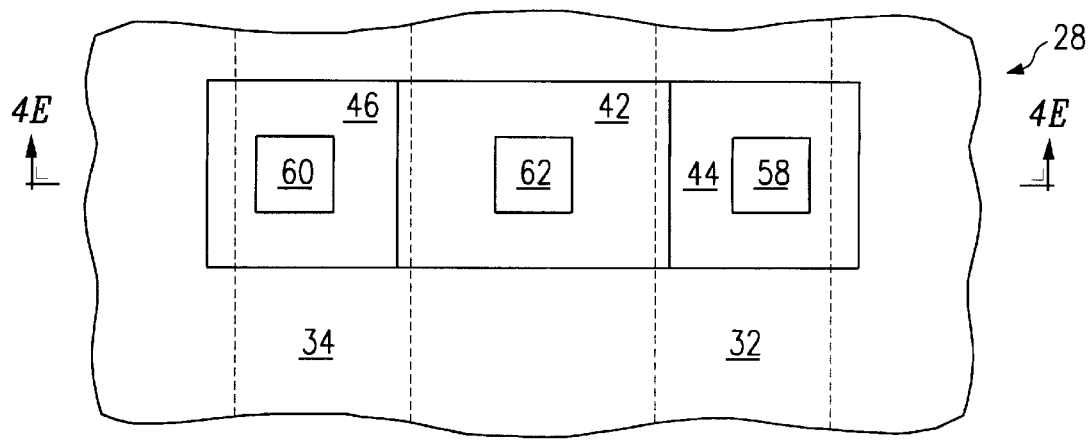
FIG. 5 contains a plan view showing a relationship between elements in one embodiment of the invention.
Figure 6:
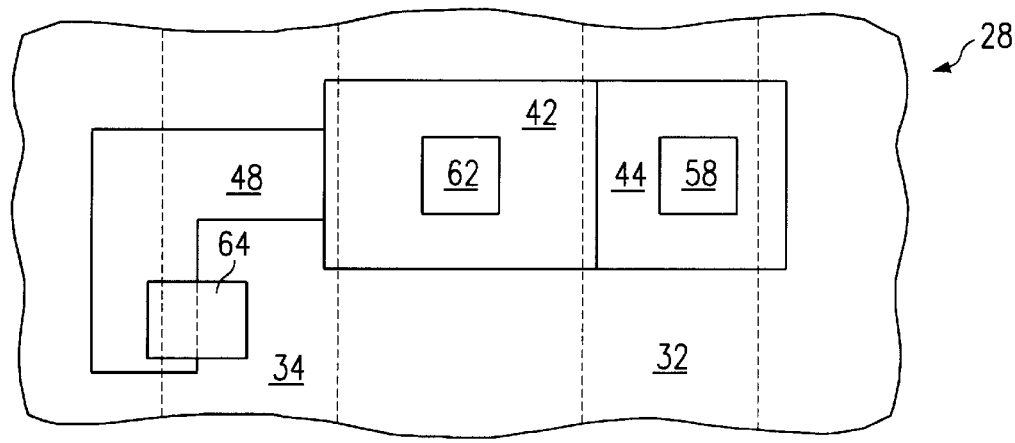
FIG. 6 contains a plan view showing a relationship between elements in an alternate embodiment of the invention.

FIG. 5 shows a plan view of one embodiment corresponding to cross-section 4E, with drain 32 and source 34 shown as diffusion lines which may connect to other devices. FIG. 6 shows an alternate plan view which includes resistor 48 as a section of the same film that forms semiconducting gate electrode 38. In such an embodiment, the resistance ratio of 38 to 48 may be determined to a large extent dimensionally, thus allowing for greater process variation in setting the intrinsic resistivity of thin film 52. In this embodiment, second contact 60 may be replaced by a substrate contact 64 as shown which connects resistor 48 directly to source 34.

The operation of a device according to the present invention having an n-channel enhancement mode substrate transistor, an n-type thin film semiconductor, and operating from supply voltages of +V and 0 V is illustrated in Table 1. In the table symbology, a Ø represents a don't care condition, while the ~ symbol indicates an approximate voltage which is dependent on the on/off resistance characteristics of semiconducting gate electrode 38.

TABLE 1

| Action | Ferro. State | $V_G$ | $V_1$ | $V_2$ | $V_3$ | $I_1$ | $I_2$ |
|---|---|---|---|---|---|---|---|
| Store 1 | Ø | 0 | +V | ~+V | Ø | HI | Ø |
| Store 0 | Ø | +V | 0 | 0 | Ø | 0 | 0 |
| Read 1 | + | +V | +V | ~+V | +V | HI | HI |
| Read 0 | − | +V | +V | ~0 | +V | LO | 0 |
| Retain | + or − | 0 | 0 | 0 | Ø | 0 | 0 |

Figure 7:
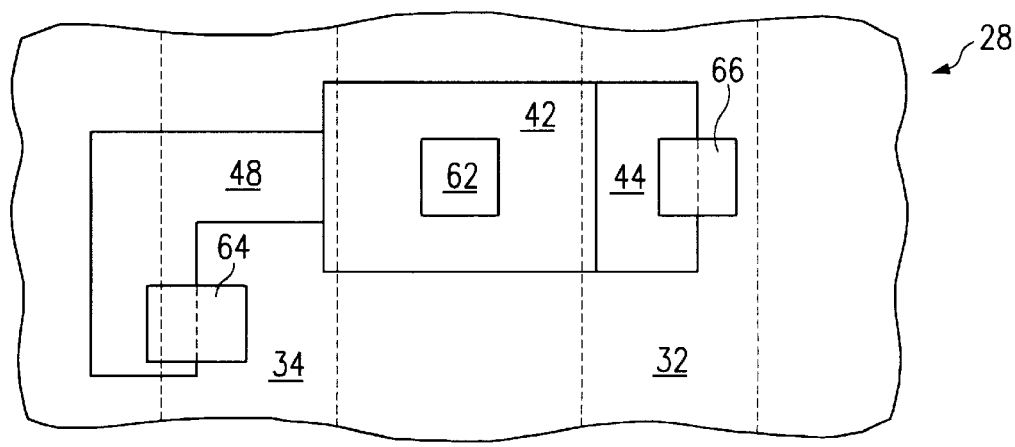
FIG. 7 contains a plan view showing a relationship between elements in another alternate embodiment of the invention.

It may be seen from Table 1 that for such an embodiment, $V_3$ is either identical to $V_1$ or has a don't care value for every state. Thus, one possible change to the circuit is to replace first contact 58 with substrate contact 66 as shown in FIG. 7. This change combines currents $I_1$ and $I_2$ of FIG. 3 external to device 28, which may produce an acceptable signal. One consideration when choosing this embodiment is that a significant current $I_2$ may flow during storing of a 1 if substrate contact 66 is used, which may or may not be tolerable.

A similar analysis may be performed for other combinations of substrate transistor and semiconductor thin film types. In some cases, a resistor tied to the drain side of semiconducting gate electrode 38 may give more desirable characteristics. In any case, resistor 48 may be remotely located or may be an active device, such as an access transistor.

It may be appreciated that a device according to the present invention may also be used as a non-volatile, non-destructive readout analog or multi-state device by setting the polarization state of ferroelectric thin film 40 to intermediate values between the positive and negative saturation values.

Other modifications to these embodiments will be apparent to those skilled in the art upon reading this description. For example, field effect transistor 26 may be a depletion mode device or a p-channel device. Semiconducting gate electrode 38 may be formed of a p-type material. Structurally, ferroelectric film 40 may be fabricated to cover only a portion of semiconducting gate 38, or to extend at least partially over drain 32 and/or source 34. Likewise, conducting electrode 42 may only cover a portion of ferroelectric film 40. Preferred materials for semiconducting gate electrode 38 include Ge, CdS, CdSe, SnO, ZnO, $In_2O_3$, and perovskite-phase oxides, generally doped to a desired intrinsic conductivity. Electrical connections may be ohmic or rectifying.

Table 2 provides a cross-reference between the Drawing and elements of some of the preferred embodiments.

TABLE 2

| # Specific Term | General Term | Other Preferred Embodiments |
| --- | --- | --- |
| 26 | field effect transistor | |
| 28 | ferroelectric device | |
| 30 single crystal silicon | semiconductor substrate | Ge, GaAs, silicon-on-insulator |
| 32 n-doped impurity region | drain region | p-doped impurity region |
| 34 n-doped impurity region | source region | p-doped impurity region |
| 36 $Si_3N_4$ over $SiO_2$ | gate dielectric | multilayer combinations of silicon dioxide, silicon nitride, silicon oxynitride |
| 38 indium-doped tin oxide | semiconducting gate electrode | Ge, CdS, CdSe, SnO, ZnO, $In_2O_3$, perovskite-phase oxides |
| 40 barium strontium titanate | ferroelectric film | barium titanate, bismuth titanate, lead zirconate titanate, lead lanthanum zirconate titanate |
| 42 platinum | conductive electrode | Au, Pd, W, TiW, TiN, TiAlN, Ta, $TiSi_2$, Al, Cu, doped poly, $RuO_2$ |
| 50 | field oxide | |
| 52 same as 38 | semiconducting thin film | same as 38 |
| 54 same as 42 | conductive thin film | same as 42 |
| 56 CVD TEOS | interlevel dielectric | spin-on or CVD glasses, including B and/or P-doped $SiO_2$, organic or hydrogen-containing dielectrics |

What is claimed is:

1. A microelectronic device comprising:
   a first field effect transistor formed in a semiconducting substrate and having a semiconducting thin film gate electrode,
   wherein said semiconducting thin film gate electrode comprises a donor-doped perovskite-phase metal oxide thin film;
   a ferroelectric thin film overlying at least a portion of said gate electrode; and
   a conductive electrode overlying said ferroelectric thin film.

2. The device of claim 1, further comprising a resistor electrically connected to one end of said semiconducting thin film gate electrode.

3. The device of claim 2, wherein said semiconducting thin film gate electrode and said resistor are formed from a common film.

4. The device of claim 2, wherein said resistor comprises a second field effect transistor integrated on said substrate.

5. The device of claim 4, wherein said second field effect transistor also functions as an access transistor for said first field effect transistor.

6. A microelectronic device comprising:
   a first field effect transistor formed in a semiconducting substrate and having a semiconducting thin film gate electrode,
   wherein said semiconducting thin film gate electrode is selected from the group of materials consisting of Ge, CdS, CdSe, SnO, ZnO, In2O3, and combinations thereof;
   a ferroelectric thin film overlying at least a portion of said gate electrode; and
   a conductive electrode overlying said ferroelectric thin film.

7. The device of claim 6, further comprising a resistor electrically connected to one end of said semiconducting thin film gate electrode.

8. The device of claim 7, wherein said semiconducting thin film gate electrode and said resistor are formed from a common film.

9. The device of claim 7, wherein said resistor comprises a second field effect transistor integrated on said substrate.

10. The device of claim 9, wherein said second field effect transistor also functions as an access transistor for said first field effect transistor.

11. A microelectronic device comprising:
   an n-channel enhancement mode field effect transistor formed in a semiconducting substrate, said transistor having a source region and a drain region spaced laterally apart in said substrate, thereby defining a channel region between said source region and said drain region,
   a gate dielectric overlying said channel region;
   an n-type semiconducting thin film gate electrode overlying said gate dielectric and having first and second electrical connections thereto, said electrical connections laterally spaced on opposite sides of said channel region;
   a resistor connected in series between said second electrical connection and said source region;
   a ferroelectric thin film overlying said gate electrode; and
   a conductive electrode overlying said ferroelectric thin film.

12. The device of claim 11, wherein said semiconducting thin film gate electrode and said resistor are formed from a common film.

13. The device of claim 11, wherein said first electrical connection electrically connects said drain region to said semiconducting thin film gate electrode.

14. The device of claim 11, wherein said resistor comprises a second field effect transistor integrated on said substrate.

15. The device of claim 14, wherein said second field effect transistor also functions as an access transistor for said n-channel enhancement mode field effect transistor.

* * * * *